United States Patent [19]

Petro

[11] Patent Number: 5,375,709

[45] Date of Patent: Dec. 27, 1994

[54] PRINTED CIRCUIT BOARD CARRIER AND REUSABLE TRANSPORT PACKAGING

[75] Inventor: Alan Petro, Milford, N.J.

[73] Assignee: Siemens Medical Systems, Inc., Iselin, N.J.

[21] Appl. No.: 73,248

[22] Filed: Jun. 4, 1993

[51] Int. Cl.⁵ ............... B65D 85/42; B65D 43/12
[52] U.S. Cl. .................. 206/328; 206/334; 206/509; 217/62
[58] Field of Search ............ 206/328, 334, 509; 217/62, 63

[56] References Cited

U.S. PATENT DOCUMENTS

| | | | |
|---|---|---|---|
| 3,182,856 | 5/1965 | Goltz | 206/509 |
| 4,293,070 | 10/1981 | Ohlbach | 206/328 |
| 4,404,615 | 9/1983 | Dep | 361/212 |
| 4,427,114 | 1/1984 | Howell et al. | 206/328 |
| 4,553,190 | 11/1985 | Mueller | 361/212 |
| 4,557,382 | 12/1985 | Johnson | 206/509 X |
| 4,561,554 | 12/1985 | Swincicki | 206/509 X |
| 4,886,163 | 12/1989 | Hubbell et al. | 206/334 |
| 5,107,989 | 4/1992 | Becker | 206/328 |
| 5,180,615 | 1/1993 | Havens | 206/328 |
| 5,244,087 | 9/1993 | Hikake et al. | 206/328 |

*Primary Examiner*—William I. Price
*Attorney, Agent, or Firm*—Mark H. Jay

[57] ABSTRACT

A modular package provides physical protection from shock, crushing and vibration. The modular package is reusable and expandable to fit a variety of sizes of printed circuit boards. In one embodiment, the package has an electrically conductive exterior and provides a faraday shield to protect the printed circuit board from damage by electrical fields.

11 Claims, 4 Drawing Sheets

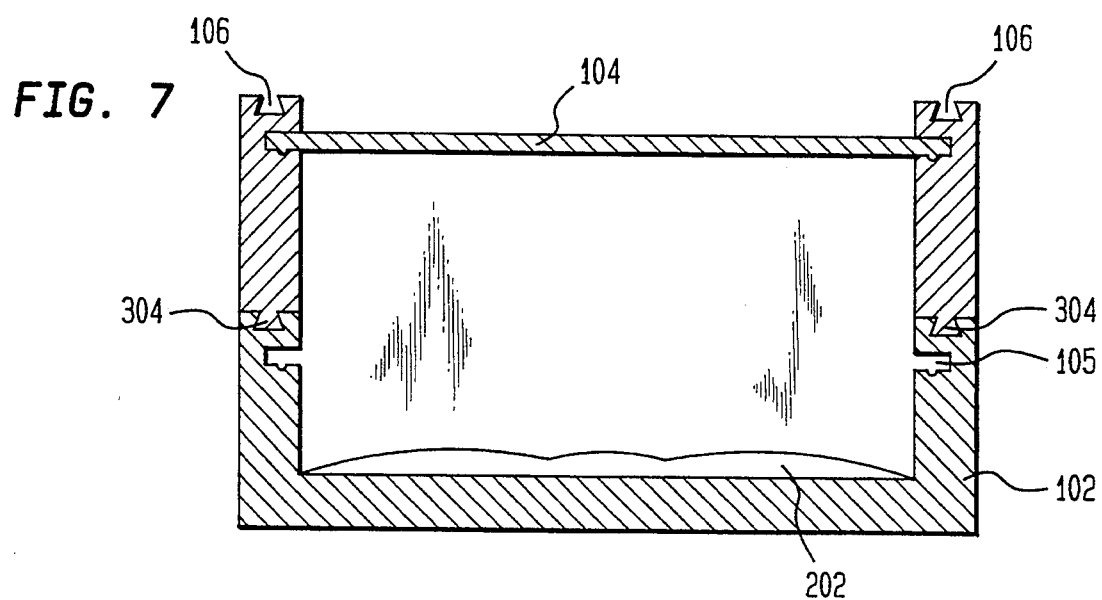
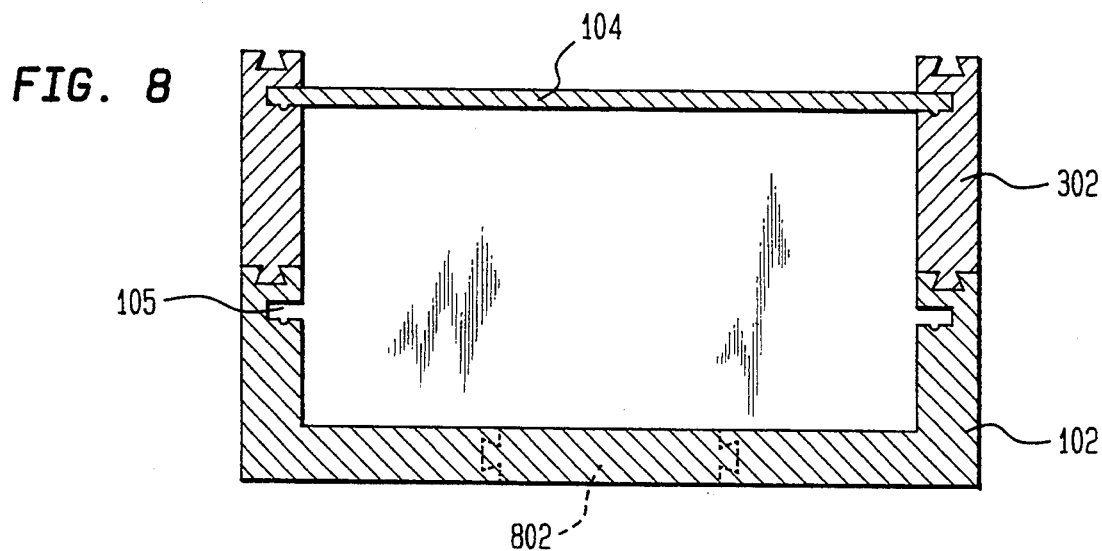
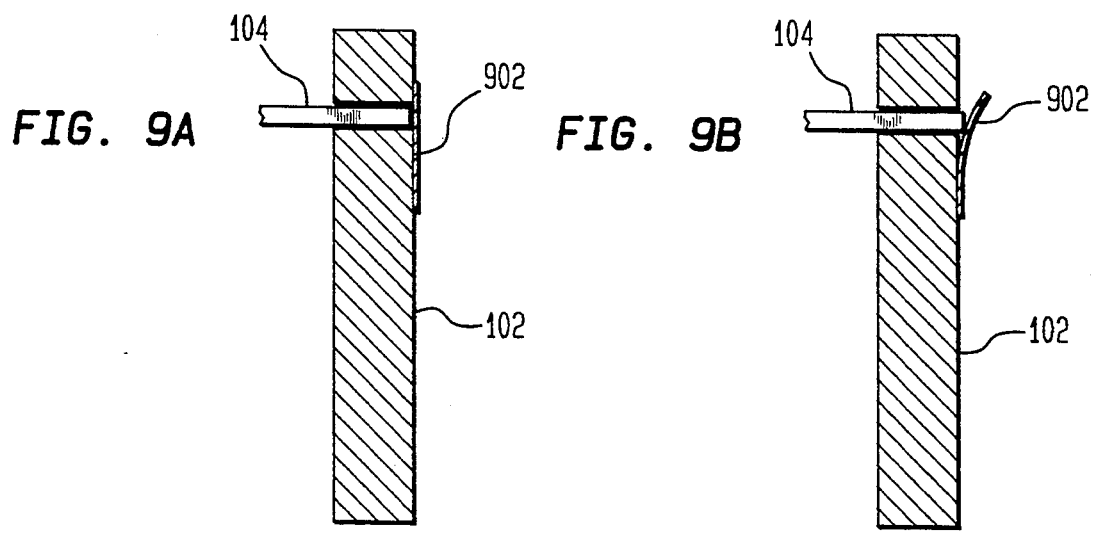

PRINTED CIRCUIT BOARD CARRIER AND REUSABLE TRANSPORT PACKAGING

BACKGROUND OF THE INVENTION

A. Field of the Invention

This invention relates to transport packaging for printed circuit boards and electronic components.

B. Related Art

Printed circuit boards carrying electronic components are used in a wide variety of applications. For example, printed circuit boards are commonly used in computers, medical equipment, communication devices and copiers. In many applications, the printed circuit boards are handled as field replaceable units (FRUs). In other words, when a component on a printed circuit board fails, a service engineer or a user will replace the entire printed circuit board at the equipment site rather than attempt to repair or replace the failing component. As a consequence of this system, spare or replacement boards are commonly transported to and/or from the site. Printed circuit boards carrying electronic components may also need to be transported for other reasons, such as assembly of a device or for use as an installable option.

One problem with the transportation of printed circuit boards and other electronic components is that they can be relatively fragile and subject to transport damage. To prevent damage, the boards or components are typically placed in a first package which provides protection from electrostatic fields. In instances where the board or component will be shipped, the package is further placed in a second package to protect the board or component from shock, crushing and vibration.

SUMMARY OF THE INVENTION

The present invention comprises a modular package that provides physical protection from shock, crushing and vibration. The modular package is reusable and expandable to fit a variety of sizes of printed circuit boards. In one embodiment, the package has an electrically conductive exterior and provides a faraday shield to protect the printed circuit board from damage by electrical fields.

BRIEF DESCRIPTION OF THE DRAWINGS

FIG. 7 is a cutaway view of the package of FIG. 4 taken along line 7—7;

FIG. 8 is a front cutaway view of an alternative embodiment of the assembly shown in FIG. 6 having expansion sections in both the vertical an horizontal directions; and, FIGS. 9A and 9B are a side cutaway view of an embodiment of the base section of FIG. 1 having a resilient member which seals the lid slot when the lid is removed.

Like reference numerals appearing in more than one figure represent like elements.

IV. DETAILED DESCRIPTION OF THE PREFERRED EMBODIMENT

Figure 1:
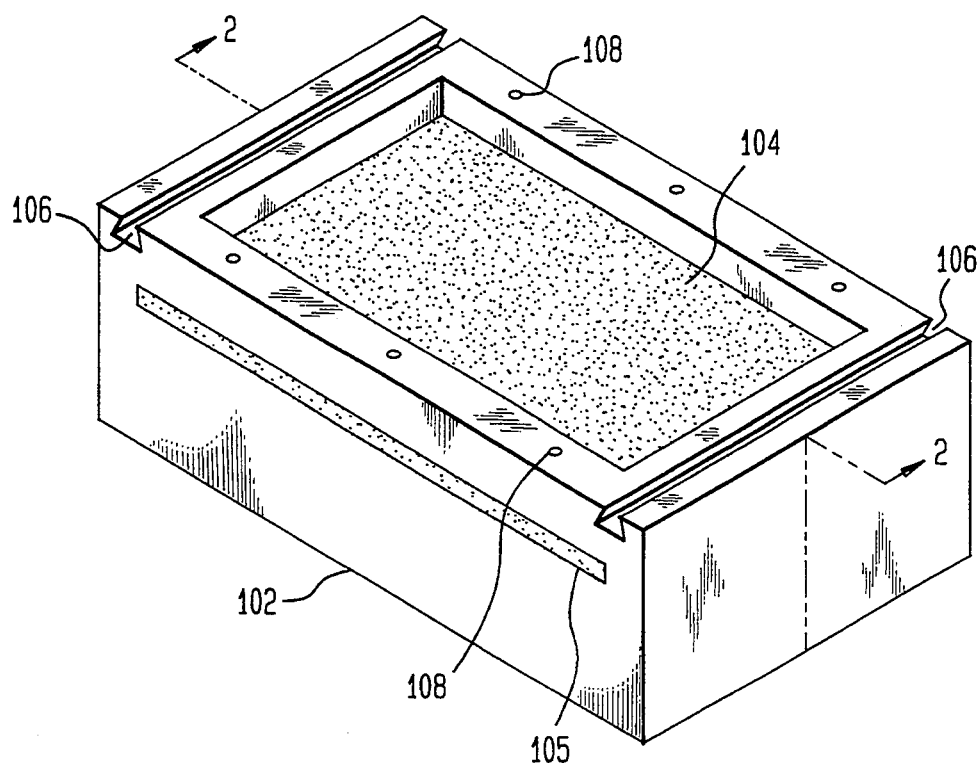
FIG. 1 is an isometric view of the base section of a package according to an embodiment of the present invention.
Figure 2:
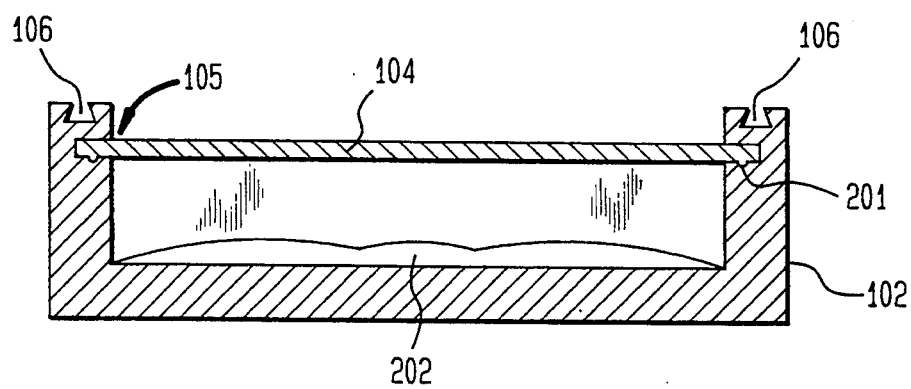
FIG. 2 is a cutaway view of the package of FIG. 1 taken along line 2—2.

A basic arrangement of the package is illustrated in FIGS. 1 and 2. The package is constructed of a base section 102 and a lid 104. The lid 104 slidably attaches to the base section 102 by way of a slot 105 and is secured in the fully inserted (closed) position by way of detents 201 (FIG. 2). The base portion of the package also includes a mounting and alignment system in the form of a dovetail shaped slot 106. The dovetail shaped slot is provided to receive a mating dovetail portion of an expansion section which will be described with reference to FIGS. 3–6. The base section 102 also includes detents for locking an expansion section into place. As best shown in FIG. 2, an integral pressure system keeps the package contents from moving during transport. The integral pressure system can be, for example: an anti-electrostatic foam or a compliant inflated membrane made of an anti-electrostatic material.

Figure 3:
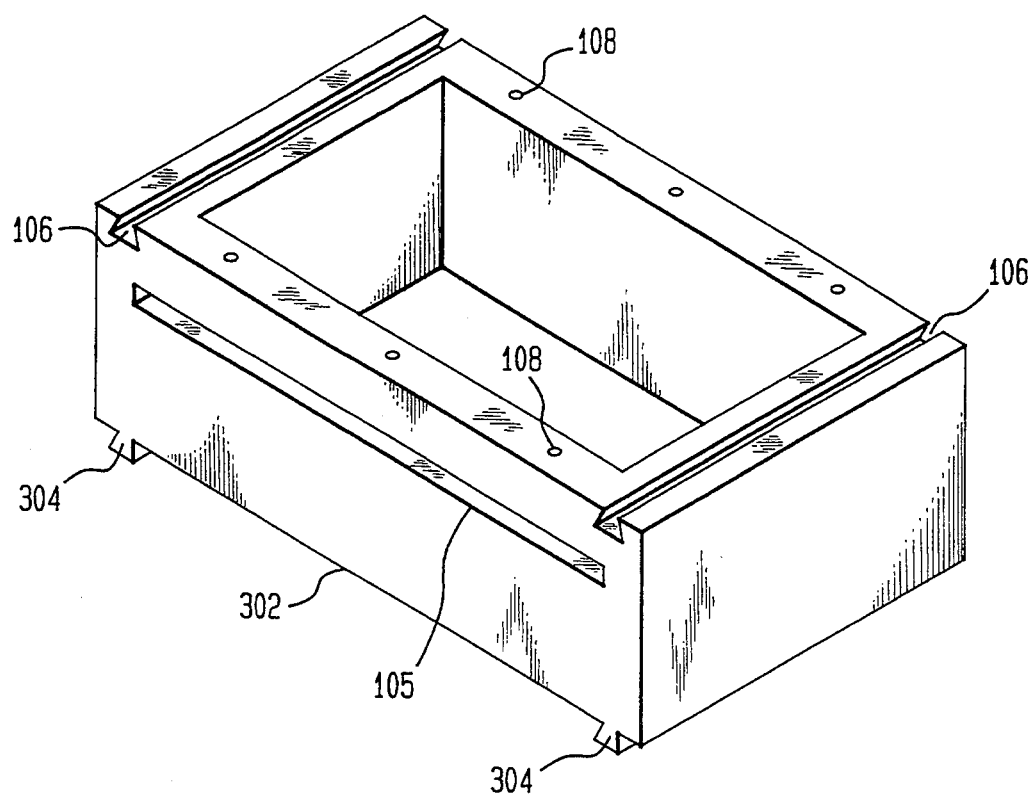
FIG. 3 is an isometric view of an expansion section for use with the base section of FIG. 1 according to an embodiment of the present invention.
Figure 4:
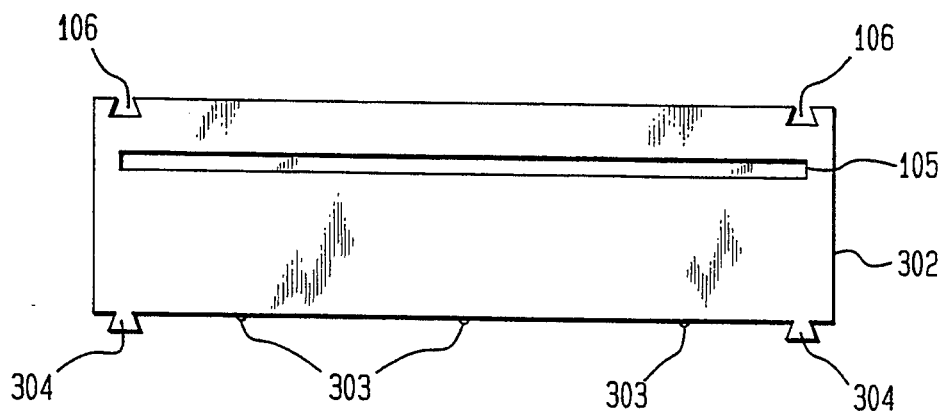
FIG. 4 is a front view of an expansion section of FIG. 3.
Figure 5:
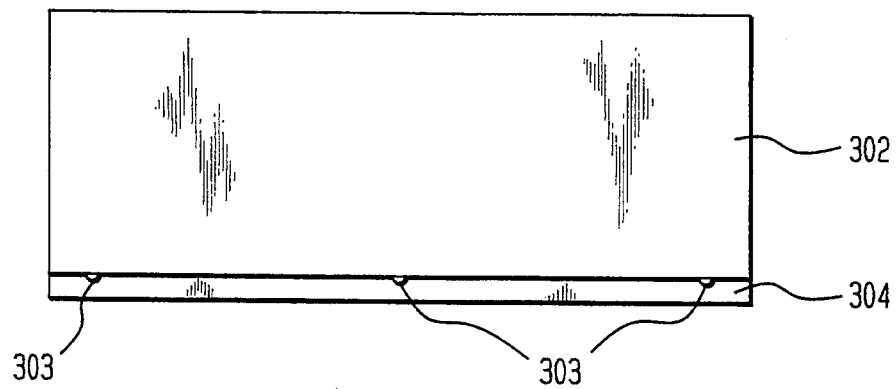
FIG. 5 is a side view of an expansion section of FIG. 3.

Various views of an expansion section are shown in FIGS. 3–5. The expansion section 302 includes dovetail shaped feet 304 which extend to the full depth (into the page of FIG. 3) of the section 302 and are shaped and sized to slidably mate with the dovetail shaped slots 106 of the base section 102. Protrusions 303 on the lower face of the expansion section 302 mate with the detents 108 in the base section 102 to securely lock the expansion section 302 into place on the base 102. The expansion section 302 also includes its own dovetail shaped slots 106 and detents 108 for receiving additional expansion sections and a slot 105, having internal detents, for receiving the lid 104.

Figure 6:
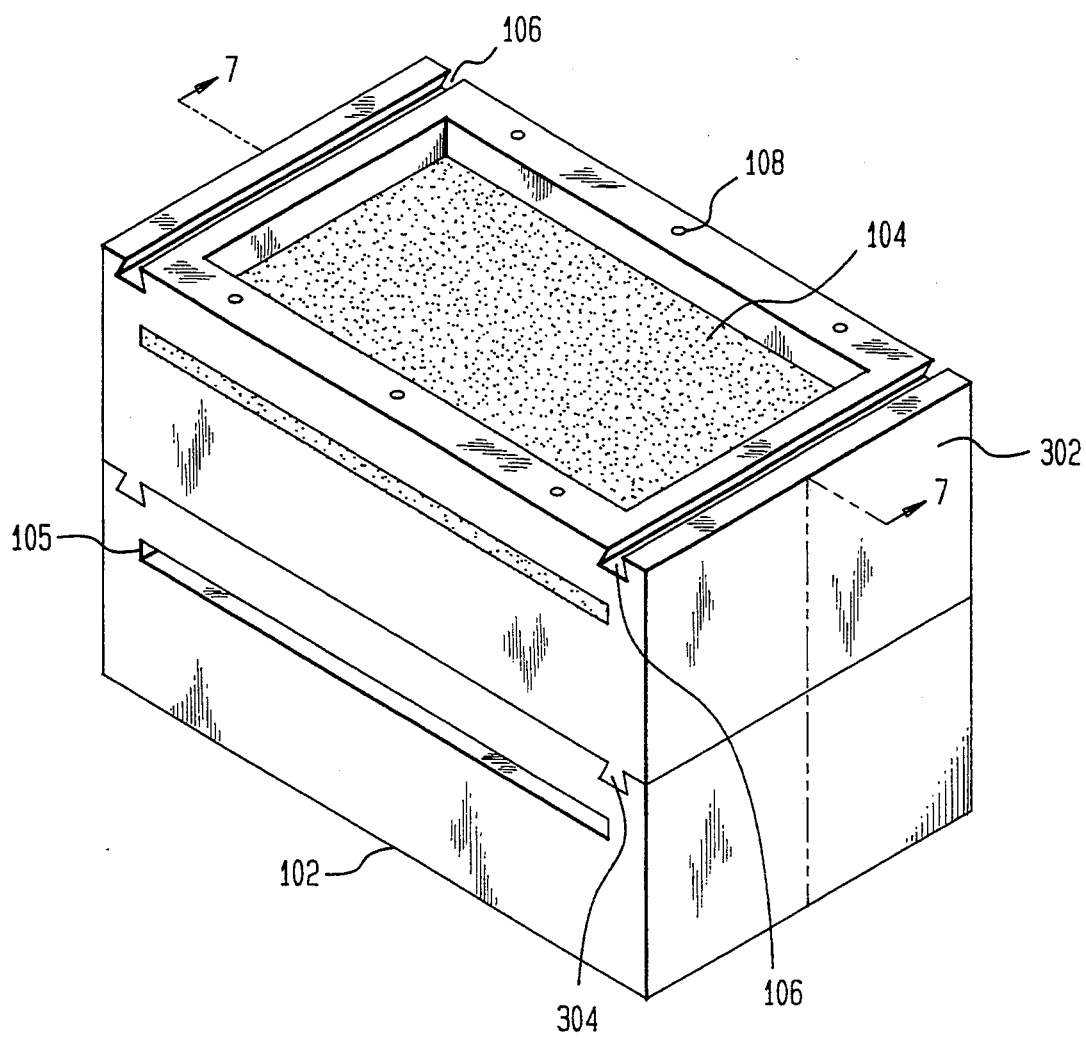
FIG. 6 is an isometric view of the expansion section of FIG. 3 mounted on the base section of FIG. 1.

FIG. 6 is an isometric view of the expansion section 302 mounted on the base section 102. Expansion sections 302 can be stacked on one another to change the height of the container. The lid 104 is placed in the slot 105 of the uppermost expansion section. FIG. 7 is a cutaway view of the package of FIG. 6 taken along line 7—7.

From FIGS. 6 and 7, it will be observed that when the lid 104 is placed in the expansion section 302, the slot 105 of the base section is left open. One alternative to this configuration is shown in FIGS. 9A and 9B. FIGS. 9A and 9B are a side cutaway view of an embodiment of the base section 102 having a resilient member 902 which seals the lid slot 105 when the lid 104 is not in place. The resilient member can be secured to the wall of the base section by cement or by fasteners such as screws. Preferably, the resilient member is secured to the base section in a manner such that it is electrically continuous with the base section 102. As shown in FIG. 9A when the lid 104 is out of the slot 105 (or is not fully inserted), a resilient member 902 seals the slot opening. When the lid 104 is in place, the resilient member flexes out of the way (due to being pushed by the lid 104) and makes contact with the lid bottom. A resilient member 902 can also be secured to the expansion section 302 in the same manner in order to cover the slot in cases where more than one expansion section is used.

FIG. 8 is a from cutaway view of an alternative embodiment of the assembly shown in FIG. 6 having a first expansion section 302 in the vertical direction and a second expansion section 802 in the horizontal direction.

The package of FIGS. 1-9 can be constructed in a number of ways. In a first embodiment, the bottom and lid can be made of an electrically conductive material (e.g. having a surface resistance of less than $10^5$ ohms per square inch) such as aluminum and lined with an electrostatic dissipative material of higher surface resistance (e.g. having a surface resistance of greater than $10^6$ ohms per square inch) such as a dissipative plastic. The resilient member can also be made of or coated with a dissipative material of the same type. In the manner, when the lid is closed the dissipative surface on the inside of the package is electrically continuous.

Alternatively, the lid and bottom can be made of a non-conductive material, such as a non-conductive plastic, having a conductive coating (e.g. aluminum). In any event the container is constructed so that the lid and the bottom form a continuous conductive envelope (a faraday shield) when the container is closed. Optionally, both the inside and the outside of the container can be coated with an electrically conductive material.

It should be understood that the conductive material need not be a solid piece. For example, the conductive material can be in the form of a screen or mesh which is integrally formed in the plastic. In this case a good contact must be maintained between the bottom portion and the lid. This contact can be maintained, for example, by having the contact surfaces of the lid and the bottom be made of solid conductive material electrically connected to the inner mesh.

Now that the invention has been described by way of the preferred embodiment, various enhancements and improvements which do not depart from the scope and spirit of the invention will become apparent to those of skill in the art. Thus it should be understood that the preferred embodiment has been provided by way of example and not by way of limitation. The scope of the invention is defined by the appended claims.

What is claimed is:

1. A package for transporting electronic components, comprising:
  a) a lid with an electrically conductive surface;
  b) a base section having a floor and a wall extending from the floor, the wall having a slot formed therein for slidably receiving a mating expansion section with an electrically conductive surface and for locking the expansion section into place so as to form an enlarged physically continuous container, said base section having an electrically conductive surface which is continuous with the electrically conductive surface of the lid and which is continuous with the electrically conductive surface of the expansion section when the expansion section is locked into place; and
  c) an antistatic material integrally attached to the base section.

2. The package of claim 1 wherein the antistatic material is an inflated membrane;

3. The package of claim 1 wherein the lid and the base section are lined with an antistatic material.

4. The package of claim 1 further comprising the expansion section and wherein the expansion section has an opening formed therein for receiving the lid and means for locking the lid into place so as to seal the package.

5. The package of claim 1 wherein the base section further comprises a resilient member secured to the wall and positioned over the opening so as to seal the opening when the lid is not in place.

6. The package of claim 1 wherein the base section and expansion section have an external surface resistance and an internal sheet resistance, the external surface resistance being less than the internal sheet resistance.

7. A package for transporting a electronic components, comprising:
  a) a lid;
  b) a base section having
    i) a floor
    ii) a wall extending from the floor, the wall having a slot formed therein for slidably receiving a mating expansion section and having detents for locking the expansion section into place, the wall also having an opening formed therein for receiving the lid and having detents formed in the opening for locking the lid into place;
  c) an inflated membrane attached to the floor, the membrane comprising and antistatic material; and,
  d) the wall, the floor and the lid each comprising an electrically conductive surface having a surface resistivity of less the $10^5$ ohms per square inch wherein when the expansion section and lid are locked into place on the base section they form an enlarged physically and electrically continuous container.

8. The package of claim 7 wherein the lid and the base section are lined with an antistatic material.

9. The package of claim 7 further comprising the expansion section and wherein the expansion section has an opening formed therein for receiving the lid and means for locking the lid into place so as to seal the package.

10. The package of claim 7 wherein the base section further comprises a resilient member secured to the wall and positioned over the opening so as to seal the opening when the lid is not in place.

11. A package for transporting a electronic components, comprising:
  a) a top section;
  b) a bottom section having a floor portion and a wall portion extended from said floor portion, at least one of said wall portion and said floor portion having means for receiving an extension section and for locking said extension section into place, said bottom section further comprising means for receiving said top section and for locking said top section into place;
  wherein the bottom section and top section have an external surface resistance and an internal sheet resistance, the external surface resistance being less than the internal sheet resistance.

* * * * *